(12) United States Patent
Han et al.

(10) Patent No.: US 9,386,706 B2
(45) Date of Patent: Jul. 5, 2016

(54) LINE WIDTH PROTECTOR PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Sung Han, Suwon-si (KR); Young Do Kweon, Suwon-si (KR); Seung Min Baek, Suwon-si (KR); Yoon Su Kim, Suwon-si (KR); Young Jae Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/140,803

(22) Filed: Dec. 26, 2013

(65) Prior Publication Data

US 2015/0041192 A1     Feb. 12, 2015

(30) Foreign Application Priority Data

Aug. 12, 2013 (KR) ........................ 10-2013-0095477

(51) Int. Cl.
*H05K 3/10* (2006.01)

(52) U.S. Cl.
CPC .......... *H05K 3/108* (2013.01); *H05K 2201/098* (2013.01); *H05K 2203/087* (2013.01); *H05K 2203/092* (2013.01); *H05K 2203/095* (2013.01); *H05K 2203/111* (2013.01);
(Continued)

(58) Field of Classification Search
USPC ................................................ 174/250–268
See application file for complete search history.

(56) References Cited

U.S. PATENT DOCUMENTS

| 5,118,386 A | * | 6/1992 | Kataoka | H01L 21/4853 174/254 |
| 6,623,803 B1 | * | 9/2003 | Krivokapic | B82Y 30/00 216/13 |
| 2003/0015345 A1 | * | 1/2003 | Arai et al. | 174/256 |

(Continued)

FOREIGN PATENT DOCUMENTS

| JP | 07-079060 | 3/1995 |
| JP | 07-212045 A | 8/1995 |

(Continued)

OTHER PUBLICATIONS

Deposition Processes—MEMSnet—MEMS Thin Film Deposition Processes—https://www.memsnet.org/mems/processes/deposition.html.*

(Continued)

*Primary Examiner* — Jeremy C Norris
*Assistant Examiner* — Muhammed Azam
(74) *Attorney, Agent, or Firm* — NSIP Law (57) ABSTRACT

A printed circuit board includes an insulating layer; and a circuit pattern formed on the insulating layer. The circuit pattern includes a seed layer and a metal layer formed on the seed layer, and both sides of the seed layer are formed with an etched groove. Also, a method of manufacturing a printed circuit board includes: forming a seed layer on the insulating layer; forming a plating resist formed with an opening on the seed layer; forming a circuit pattern by performing plating processing on the opening; removing the plating resist; forming a passivation layer on the circuit pattern; performing dry etching on a remaining portion other than a side wall of the passivation layer; and performing wet etching the seed layer exposed on a surface by the dry etching.

7 Claims, 6 Drawing Sheets

(52) U.S. Cl.
CPC ............. *H05K 2203/1105* (2013.01); *H05K 2203/1184* (2013.01); *H05K 2203/1383* (2013.01); *Y10T 29/49155* (2015.01)

(56) References Cited

U.S. PATENT DOCUMENTS

| | | | | |
|---|---|---|---|---|
| 2004/0014312 | A1* | 1/2004 | Kunishima et al. | 438/637 |
| 2005/0161250 | A1* | 7/2005 | Hiramoto | 174/250 |
| 2008/0236872 | A1* | 10/2008 | Kataoka et al. | 174/254 |
| 2009/0183901 | A1* | 7/2009 | Kataoka et al. | 174/257 |
| 2011/0108313 | A1* | 5/2011 | Kung | 174/261 |
| 2013/0256006 | A1* | 10/2013 | Sakaguchi et al. | 174/254 |
| 2014/0076619 | A1* | 3/2014 | Han et al. | 174/257 |

FOREIGN PATENT DOCUMENTS

| | | |
|---|---|---|
| JP | 07-235618 A | 9/1995 |
| JP | 10-500609 A | 1/1998 |
| JP | 2002-124460 A | 4/2002 |
| JP | 2009-253268 A | 10/2009 |
| JP | 2009-277905 A | 11/2009 |
| KR | 10-2010-0029561 A | 3/2010 |
| WO | 95/24275 | 9/1995 |

OTHER PUBLICATIONS

Office action dated Jun. 19, 2014 from corresponding Korean Patent Application No. 10-2013-0095477 and its English summary provided by the clients.

Office action dated Jul. 29, 2014 from corresponding Japanese Patent Application No. 2013-268846 and its English summary provided by the applicant.

\* cited by examiner

FIG.12B

LINE WIDTH PROTECTOR PRINTED CIRCUIT BOARD AND METHOD OF MANUFACTURING THE SAME

CROSS REFERENCE TO RELATED APPLICATION

This application claims the benefit of Korean Patent Application No. 10-2013-0095477, filed on Aug. 12, 2013, entitled "Printed Circuit Board And Method Of Manufacturing The Same", which is hereby incorporated by reference in its entirety into this application.

BACKGROUND OF THE INVENTION

1. Technical Field

The present invention relates to a printed circuit board and a method of manufacturing the same.

2. Description of the Related Art

Recently, a demand for a pitch of 10 μm/10 μm or less has been increased in a board for a package, such as a flip chip ball grid array (FCBGA) of a printed circuit board. As a result, in addition to a modified semi-additive process (MSAP), many methods have been developed. A fine circuit may be implemented in a product, such as the FCBGA of 5 μm/5 μm or less and an interposer of 3 μm/3 μm or less. In implementing the fine circuit, consequently, a method of plating the seed layer needs to etch the seed layer without debris. In this case, the seed layer may be formed to have a surface without debris by over etching the seed layer to be larger than a thickness of the seed layer but the change in a circuit line width may occur. The change in a circuit line width causes a deformation of a board, and thus an exposure resolution higher than a desired line width in the actual process is required. Further, due to a problem of an undercut, a circuit having 3 μm/3 μm may be implemented by restricting the change in the circuit line width to a ratio of a higher unbalance. The influence of the undercut becomes more problematic in the fine circuit. In severe case, since the undercut is progressed to a depth of several μm to cause a delamination phenomenon of a circuit line (RDL), it is very difficult to implement the fine circuit. In addition, since a future fine circuit related technology requires a new line width structure having a higher aspect ratio than the present, a technology of making a dimension constant by protecting a side of the circuit line and a technology of preventing the undercut are necessarily required for products, such as a flip chip ball grid array, a flexible printed circuit (FPC) having a driving drive, and an interposer serving to correct a difference between line widths of a chip die and the board.

Meanwhile, Patent Document 1 discloses a method of manufacturing a printed circuit board which prevents a circuit pattern from etching at the time of flash etching, but has a problem in that an effect of protecting the line width of the circuit pattern and suppressing the undercut may not be sufficiently implemented.

Patent Document 1: Korean Patent Laid-Open Publication No. 2010-0029561

Therefore, the present invention is completed by forming etched grooves at both sides of the seed layer of the circuit pattern of the printed circuit board so as to protect a line width of the circuit pattern and suppress an undercut.

SUMMARY OF THE INVENTION

The present invention has been made in an effort to provide a printed circuit board capable of protecting a line width of a circuit pattern and suppressing an undercut.

Further, the present invention has been made in an effort to provide a method of manufacturing a printed circuit board.

According to a preferred embodiment of the present invention, there is provided a printed circuit board, including: an insulating layer; and a circuit pattern formed on the insulating layer, wherein the circuit pattern includes a seed layer and a metal layer formed on the seed layer and both sides of the seed layer are formed with an etched groove.

The printed circuit board may further include: a passivation layer formed on a side wall of the circuit pattern.

A length of the etched groove may be ⅛ or less of a line width of the circuit pattern.

A height of the etched groove may be ⅛ or less of a height of the circuit pattern.

A height of an inlet of the etched groove may be equal to that of the seed layer.

The circuit pattern may be made of at least one metal selected from a group consisting of copper (Cu), platinum (Pt), gold (Au), silver (Ag), molybdenum (Mo), tungsten (W), nickel (Ni), titanium (Ti), and chromium (Cr).

A height of the seed layer may be 0.05 to 2 μm from an upper surface of the insulating layer.

According to another preferred embodiment of the present invention, there is provided a method of manufacturing a printed circuit board, including: forming a seed layer on the insulating layer; forming a plating resist formed with an opening on the seed layer; forming a circuit pattern by performing plating processing on the opening; removing the plating resist; forming a passivation layer on the circuit pattern; performing dry etching on a remaining portion other than a side wall of the passivation layer; and performing wet etching the seed layer exposed on a surface by the dry etching.

The method of manufacturing a printed circuit board may further include: removing the passivation layer of the side wall of the circuit pattern by a plasma ashing process.

The forming of the seed layer on the insulating layer may be performed by at least one of a sputtering deposition method, an electroless plating method, and a metal thin film laminating method.

The forming of the plating resist formed with the opening on the seed layer may be performed by exposing and developing a position corresponding to the circuit pattern.

In the forming of the circuit pattern by performing plating processing on the opening, the circuit pattern may be formed on the seed layer exposed through the opening by an electroplating method.

The forming of the passivation layer on the circuit pattern may be performed by a plasma deposition method using at least one gas selected from $CH_4$, $C_2H_2$, $C_4H_8$, $CF_4$, $C_2F_6$, $C_3F_8$, $C_4F_8$, and $CHF_3$.

The gas may include at least one selected from argon (Ar), neon (Ne), xenon (Xe), nitrogen ($N_2$), and hydrogen ($H_2$).

The dry etching of the remaining portion other than the side wall of the passivation layer may be performed by oxygen reactive ion etching or ion beam etching.

The oxygen reactive ion etching process may be performed by argon (Ar), hydrogen ($H_2$), nitrogen ($N_2$), or a mixed gas thereof.

The wet etching of the seed layer exposed on the surface by the dry etching may be performed by sulfuric acid ($H_2SO_4$), hydrogen peroxide ($H_2O_2$), copper chloride ($CuCl_2$), ferric chloride ($FeCl_3$), nitric acid ($HNO_3$), phosphoric acid ($H_3PO_4$), or a mixture thereof.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Before the present invention is described in more detail, it must be noted that the terms and words used in the present specification and claims should not be interpreted as being limited to typical meanings or dictionary definitions, but should be interpreted as having meanings and concepts relevant to the technical scope of the present invention based on the rule according to which an inventor can appropriately define a concept implied by a term to best describe the method he or she knows for carrying out the invention. Further, the embodiments of the present invention are merely illustrative, and are not to be construed to limit the scope of the present invention, and thus there may be a variety of equivalents and modifications able to substitute for them at the point of time of the present application.

In the following description, it is to be noted that embodiments of the present invention are described in detail so that the present invention may be easily performed by those skilled in the art, and also that, when known techniques related to the present invention may make the gist of the present invention unclear, a detailed description thereof will be omitted.

Figure 1:
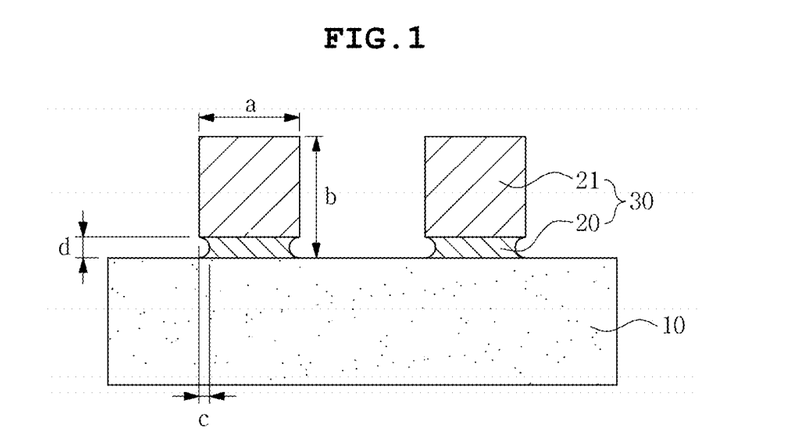
FIG. 1 is a cross-sectional view illustrating a printed circuit board according to the preferred embodiment of the present invention.

According to a preferred embodiment of the present invention, as illustrated in FIG. 1 by way of example, in a circuit pattern 30 including a seed layer 20 and a metal layer 21 formed on an insulating layer 10, a printed circuit board in which etched grooves are formed at both sides of the seed layer 20 and a method of manufacturing the same are provided.

Printed Circuit Board

FIG. 1 is a cross-sectional view illustrating a printed circuit board according to the preferred embodiment of the present invention.

In the printed circuit board according to the representative preferred embodiments of the present invention, the circuit pattern is formed on the insulating layer by forming the seed layer on the insulating layer through electroless plating and forming the metal layer on the seed layer by electroplating. Next, during a process of etching a portion of the seed layer formed on the insulating layer for electrical connection, the printed circuit board in which etched grooves are formed at both sides of the seed layer of the circuit pattern is formed.

The etched grooves are formed during the etching of the seed layer and are formed at both sides of the circuit pattern and have a depressed semi-spherical arch shape. Referring to FIG. 1, a length c of the etched groove is not particularly limited, but is preferably ⅛ or less of a line width a of the circuit pattern and a height d of the etched groove is also preferably ⅛ or less of a height b of the circuit pattern. When the length and the height of the etched groove are ⅛ or more of the line width and the height of the circuit pattern, the undercut which is a problem of the prior art may occur. Therefore, in order to prevent the undercut while protecting the line width of the circuit pattern, the length and the height of the etched groove are preferably ⅛ or less of the line width and the height of the circuit pattern. Further, a height of an inlet of the etched groove may equal to a height of the seed layer and may be appropriate to have a height of 0.05 to 2 μm from an upper surface of the insulating layer. When the height is less than 0.05 μm, over etching may occur up to a portion of the insulating layer during the etching process of the seed layer and when the height exceeds 2 μm, the printed circuit board may not be implemented to be light and thin.

The circuit pattern is formed on the insulating layer by the electroless plating and the electroplating, but may be made of at least one metal selected from a group consisting of copper (Cu), platinum (Pt), gold (Au), silver (Ag), molybdenum (Mo), tungsten (W), nickel (Ni), titanium (Ti), and chromium (Cr) without being particularly limited, but may be preferably made of copper (Cu) in consideration of electrical resistivity and economic efficiency.

Figure 2:
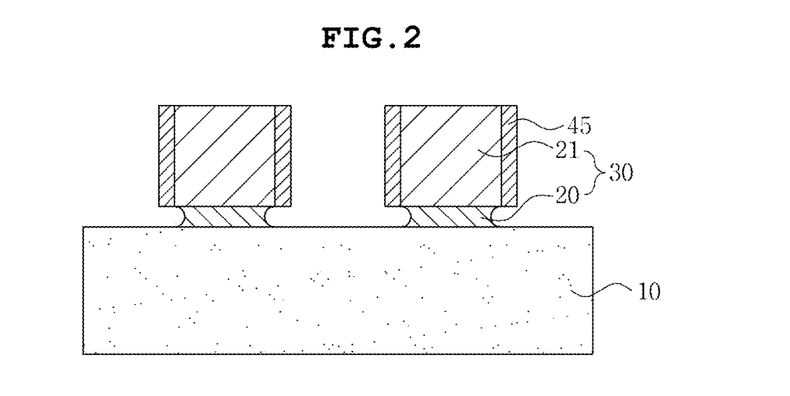
FIG. 2 is a cross-sectional view illustrating the printed circuit board according to another preferred embodiment of the present invention in which a passivation layer is formed on a side wall portion of a circuit pattern.

FIG. 2 is a cross-sectional view of the printed circuit board in which a side wall of the circuit pattern according to the preferred embodiment of the present invention is formed with a passivation layer. Referring to FIG. 2, the printed circuit board including the circuit pattern 30 in which a side wall of the metal layer 21 on the seed layer 20 is formed with a passivation layer 45 may be formed. Further, when the side wall is further stacked with the insulating layer while being formed with the passivation layer, a region in which the passivation layer and the etched groove are combined with each other is formed, such that the insulating layer 10 and the circuit pattern 30 may be physically anchored with each other.

Method of Manufacturing Printed Circuit Board

Figure 3:
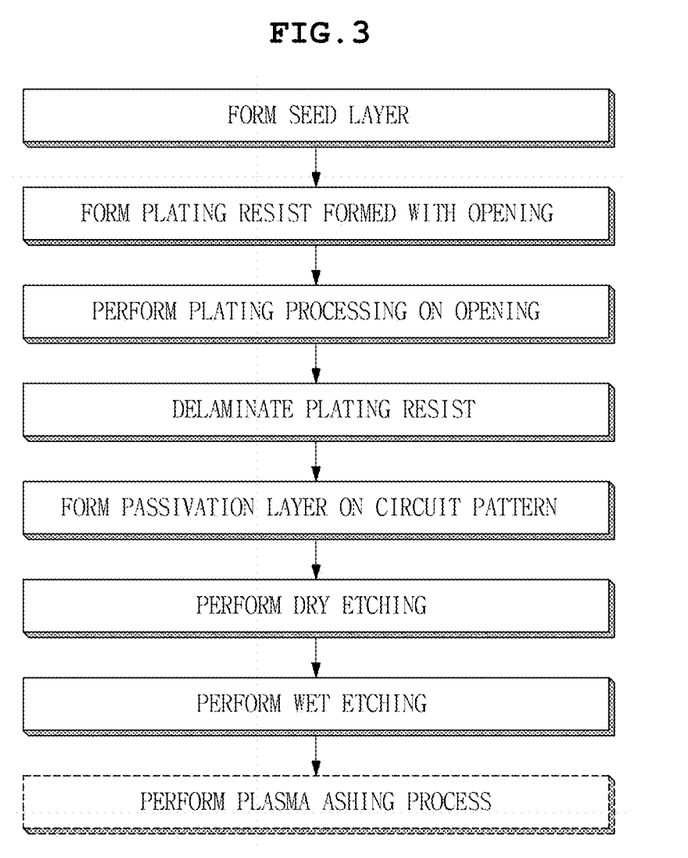
FIG. 3 is a block diagram schematically illustrating a process of manufacturing the printed circuit board according to the preferred embodiment of the present invention.

FIG. 3 is a block diagram schematically illustrating a process of manufacturing the printed circuit board according to the preferred embodiment of the present invention.

FIGS. 4 to 11 are cross-sectional views illustrating each step of a process of forming the etched grooves of the printed circuit board according to the preferred embodiment of the present invention.

For example, in the block diagram as illustrated in FIG. 3, the method of manufacturing a printed circuit board according to the preferred embodiment of the present invention may selectively include: preparing the insulating layer having the seed layer; forming a plating resist formed with an opening on the seed layer; forming the circuit pattern by performing plating processing on the opening; removing the plating resist; forming the passivation layer on the circuit pattern; performing dry etching on the remaining portion other than the side wall of the passivation layer; and performing wet etching on the seed layer exposed on the surface by the dry etching, and the manufacturing method may selectively include removing the passivation layer of the side wall of the circuit pattern by a plasma ashing process.

Figure 4:
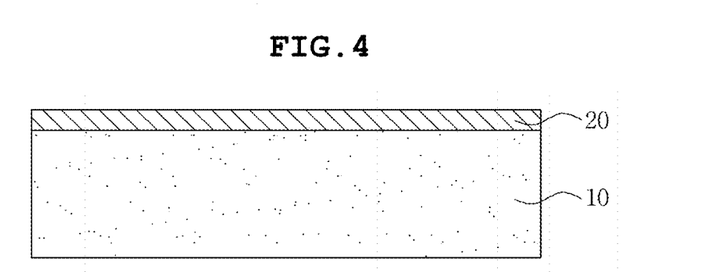
FIGS. 4 to 11 are process diagrams schematically illustrating each step of a process of forming the etched grooves of the printed circuit board according to the preferred embodiment of the present invention.

Referring to FIG. 4, the forming of the seed layer 20 on the insulating layer 10 is not particularly limited, but may be performed by at least one of a sputtering deposition method, an electroless plating method, and a metal thin film laminating method, but the seed layer 20 may be preferably formed by the electroless plating method. The seed layer 20 is appropriate to have a thickness of 0.05 to 2 μm from the upper surface of the insulating layer 10 and may be preferably made of copper (Cu) in consideration of the electrical resistivity and the economic efficiency. Further, the seed layer may be formed using a copper clad laminate (CCL) by a modified semi additive process (MSAP).

Figure 5:
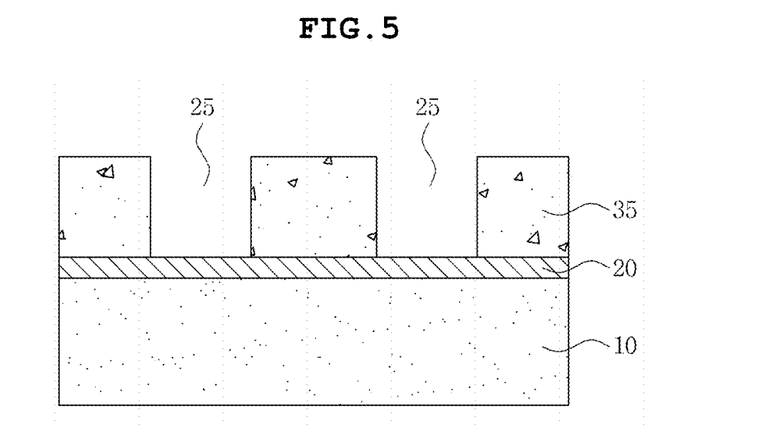

Referring to FIG. 5, the forming of the plating resist 35 formed with the opening 25 on the seed layer 20 may be performed by exposing and developing a position corresponding to the circuit pattern. The plating resist 35 is not particularly limited in the preferred embodiment of the present invention, but may preferably use a photo resist made of a photosensitive material. Further, the opening 25 may also be formed at a position corresponding to the circuit pattern by exposing the plating resist 35 and performing the laser machining thereon.

Figure 6:
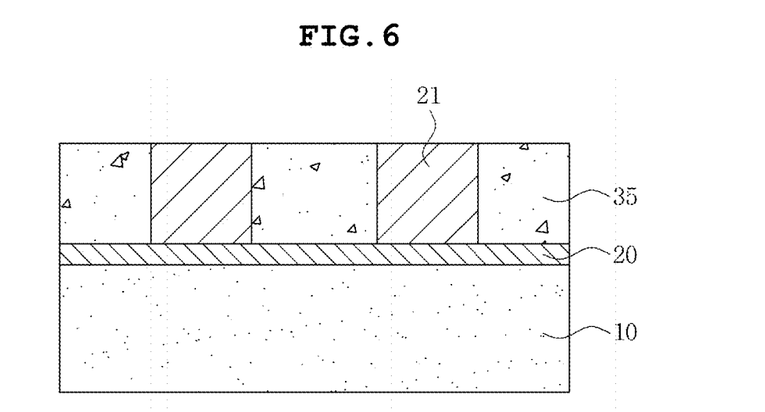

Referring to FIG. 6, in the forming of the circuit pattern by plating the opening, the circuit pattern may be formed on the seed layer 20 exposed through the opening 25 by the electroplating method. The circuit pattern is a path through which an electrical signal of the printed circuit board is transferred and may be formed using the electroplating method by making a current flowing onto the seed layer 20. The metal layer 21 formed on the seed layer 20 by the electroplating method is not particularly limited, but may be preferably made of copper (Cu) in consideration of the electrical resistivity and economic efficiency.

Figure 7:
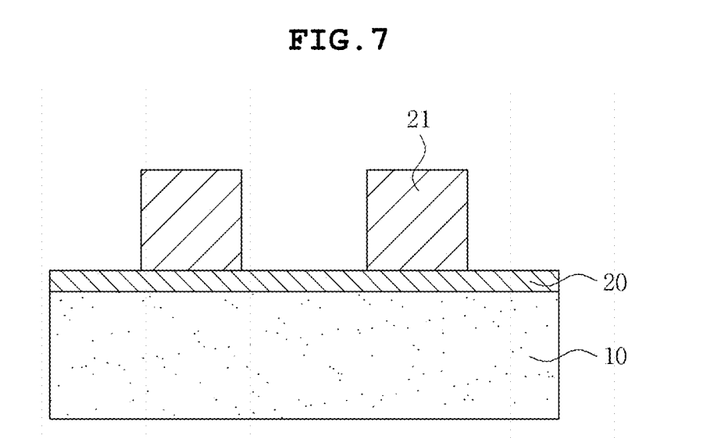

Referring to FIG. 7, in the removing of the plating resist, the seed layer 20 and the metal layer 21 are exposed by removing the plating resist layer using an alkaline material, such as sodium hydroxide (NaOH) which does not affect the circuit pattern.

Figure 8:
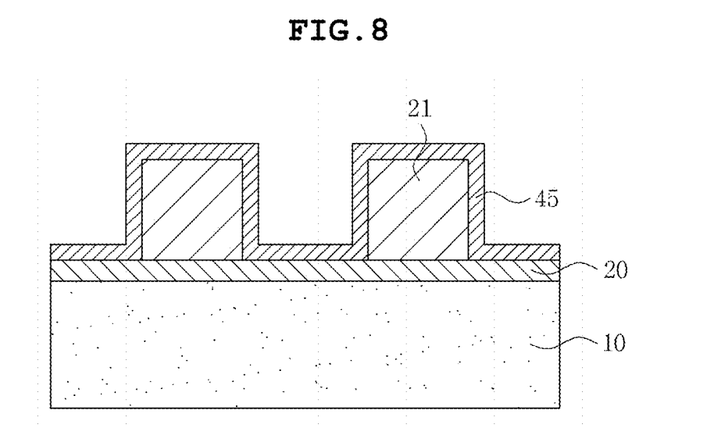

Referring to FIG. 8, the forming of the passivation layer 45 on the seed layer 20 and the metal layer 21 may be performed by a plasma deposition method using at least one gas selected from $CH_4$, $C_2H_2$, $C_4H_8$, $CF_4$, $C_2F_6$, $C_3F_8$, $C_4F_8$, and $CHF_3$. The passivation layer 45 is made of a plasma 3D-network polymer and may be formed by the plasma deposition method which applies power to the seed layer 20 and the metal layer 21 under the vacuum state and discharges the power, deposits a single molecule including carbon (C), hydrogen (H), fluorine (F), and nitrogen (N), and further includes at least one gas selected from $CH_4$, $C_2H_2$, $C_4H_8$, $CF_4$, $C_2F_6$, $C_3F_8$, $C_4F_8$, and $CHF_3$ and at least one gas selected from argon (Ar), neon (Ne), xenon (Xe), nitrogen ($N_2$), and hydrogen ($H_2$) to improve stability of plasma and chemical resistivity against an acid of a layer deposited after reaction.

Figure 9:
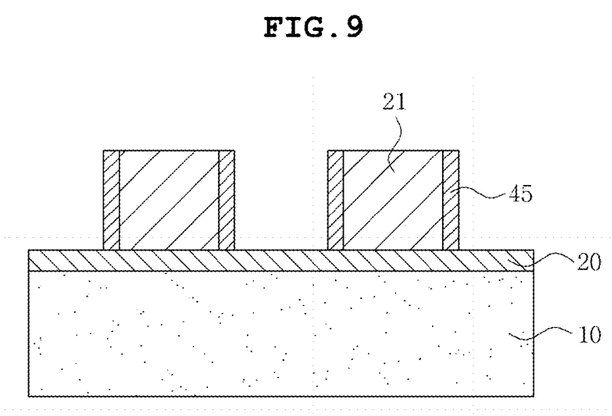

Referring to FIG. 9, the dry etching of the remaining portion other than the side wall of the passivation layer 45 may be performed by oxygen reactive ion etching ($O_2$ RIE) or ion beam etching. The oxygen reactive ion etching uses argon (Ar), hydrogen ($H_2$), nitrogen ($N_2$), or a mixed gas thereof and in order to increase an etching rate, it is appropriate to heat the board. The oxygen reactive ion etching is a method of forming plasma and performing vertically anisotropic etching on the passivation layer 45 formed on the seed layer 20 and the metal layer 21 by applying a voltage thereto. Further, when the oxygen reactive ion etching is performed without applying a voltage thereto, the isotropic etching may be performed. The ion beam etching is a technology of forming plasma using the ion beam and extracting ions by applying a voltage thereto to have straightness, thereby achieving the targeted energy distribution and may use oxygen ($O_2$) or nitrogen oxide ($N_2O$). Even in the case of using the ion beam in the etching process, it is appropriate to heat the board to increase the etching rate.

Figure 10:
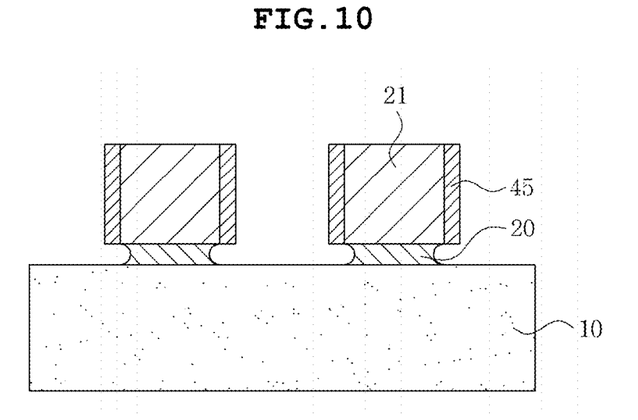

Referring to FIG. 10, the wet etching of the seed layer 20 exposed on the surface by the dry etching may be performed with sulfuric acid ($H_2SO_4$), hydrogen peroxide ($H_2O_2$), copper chloride ($CuCl_2$), ferric chloride ($FeCl_3$), nitric acid ($HNO_3$), phosphoric acid ($H_3PO_4$), or a mixture thereof which may corrode metal. The wet etching is not particularly limited, but the flash etching is preferable.

Figure 11:
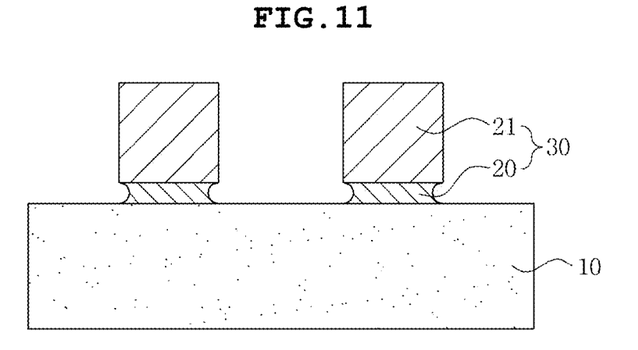

Further, referring to FIG. 11, the passivation layer remaining on the side wall of the circuit pattern after the wet etching may be removed by the plasma ashing process without applying a voltage to the board using the oxygen plasma ($O_2$ plasma), but the preferred embodiment of the present invention is not limited thereto. Further, the passivation layer remaining on the side wall of the circuit pattern may be removed or may not be removed and the removing of the passivation layer may be omitted.

Figure 12A:
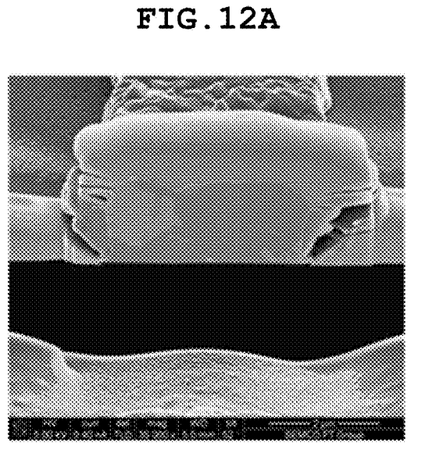
FIG. 12A is a photograph illustrating the circuit pattern of the printed circuit board according to the representative preferred embodiment of the present invention on which the etched grooves are formed.

FIG. 12A is a photograph illustrating the circuit pattern of the printed circuit board according to the representative preferred embodiment of the present invention on which the etched grooves are formed.

Figure 12B:
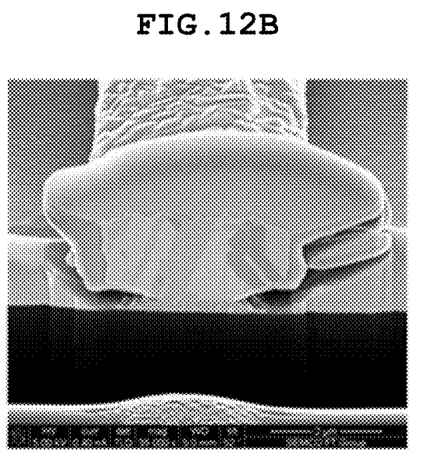
FIG. 12B is a photograph illustrating the circuit pattern of the printed circuit board on which the undercut occurs.

FIG. 12B is a photograph illustrating the circuit pattern of the printed circuit board according to the prior art on which the undercut occurs.

Referring to FIGS. 12A and 12B, FIG. 12A is a photograph illustrating the circuit pattern of the printed circuit board according to the representative preferred embodiment of the present invention on which the etched grooves are formed and FIG. 12B is a photograph illustrating the circuit pattern of the printed circuit board on which the undercut occurs. Therefore, comparing the printed circuit board according to the representative preferred embodiment of the present invention with the printed circuit board according to the related art on which the undercut occurs, the line width of the circuit pattern may be protected and the etched groove much smaller than the undercut may be formed to prevent the deformation or defect of the circuit pattern.

As set forth above, according to the printed circuit board and the method of manufacturing the same, the undercut against the wet etching may be suppressed by forming the passivation layer on the circuit pattern, thereby protecting the line width of the circuit pattern.

According to the printed circuit board and the method of manufacturing the same according to the representative preferred embodiment of the present invention, it is possible to protect the line width of the circuit pattern and suppress the undercut by providing the printed circuit board in which the etched grooves are formed at both sides of the seed layer of the circuit pattern.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:
1. A printed circuit board, comprising:
an insulating layer; and
a circuit pattern formed on the insulating layer,
wherein the circuit pattern includes a seed layer and a metal layer formed on the seed layer, and both sides of the seed layer are formed with an etched groove.

2. The printed circuit board as set forth in claim 1, further comprising:
   a passivation layer formed on a side wall of the circuit pattern.

3. The printed circuit board as set forth in claim 1, wherein a length of the etched groove is ⅛ or less of a line width of the circuit pattern.

4. The printed circuit board as set forth in claim 1, wherein a height of the etched groove is ⅛ or less of a height of the circuit pattern.

5. The printed circuit board as set forth in claim 1, wherein a height of an inlet of the etched groove is equal to that of the seed layer.

6. The printed circuit board as set forth in claim 1, wherein the circuit pattern is made of at least one metal selected from a group consisting of copper (Cu), platinum (Pt), gold (Au), silver (Ag), molybdenum (Mo), tungsten (W), nickel (Ni), titanium (Ti), and chromium (Cr).

7. The printed circuit board as set forth in claim 1, wherein a height of the seed layer is 0.05 to 2 μm from an upper surface of the insulating layer.

\* \* \* \* \*